(12) United States Patent
Watanabe et al.

(10) Patent No.: US 6,462,991 B2
(45) Date of Patent: Oct. 8, 2002

(54) METHOD OF ERASING DATA STORED IN A NONVOLATILE MEMORY

(75) Inventors: Kenichi Watanabe; Takuji Yoshida, both of Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/878,915

(22) Filed: Jun. 13, 2001

(65) Prior Publication Data

US 2002/0015330 A1 Feb. 7, 2002

(30) Foreign Application Priority Data

Jun. 15, 2000 (JP) ........................................ 2000-179701

(51) Int. Cl.[7] .............................................. G11C 16/04
(52) U.S. Cl. .............................. 365/185.29; 365/185.24
(58) Field of Search ....................... 365/185.29, 185.03, 365/185.19, 185.24

(56) References Cited

U.S. PATENT DOCUMENTS 5,946,231 A * 8/1999 Endoh et al. .......... 365/185.03
6,091,637 A * 7/2000 Hakozaki ................ 365/185.22

FOREIGN PATENT DOCUMENTS

| JP | 10-083685 | 3/1998 |
| JP | 11-176171 | 7/1999 |
| JP | 11-176175 | 7/1999 |

* cited by examiner

*Primary Examiner*—Vu A. Le
(74) *Attorney, Agent, or Firm*—Volentine Francos, PLLC

(57) ABSTRACT

A method for erasing data of a nonvolatile memory includes adjusting a threshold voltage of a memory cell transistor to a first threshold voltage; adjusting the threshold voltage of the memory cell transistor to a second threshold voltage, the second threshold voltage being lower than the first threshold voltage; adjusting the threshold voltage of the memory cell transistor to a third threshold voltage, the third threshold voltage being higher than the second threshold voltage and being lower than the first threshold voltage; and adjusting the threshold voltage of the memory cell transistor to a fourth threshold voltage, the fourth threshold voltage being lower than the second threshold voltage.

21 Claims, 7 Drawing Sheets

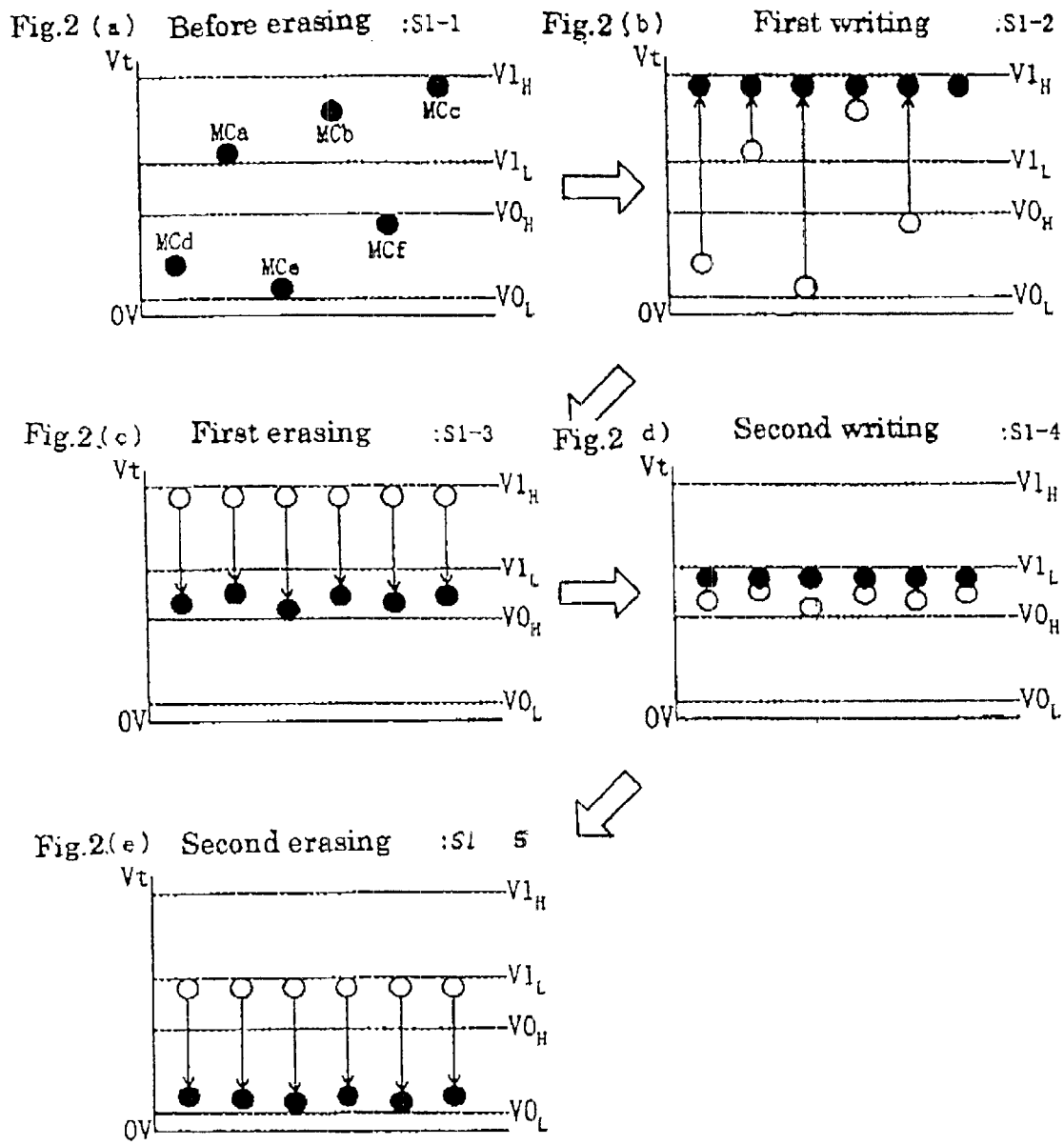

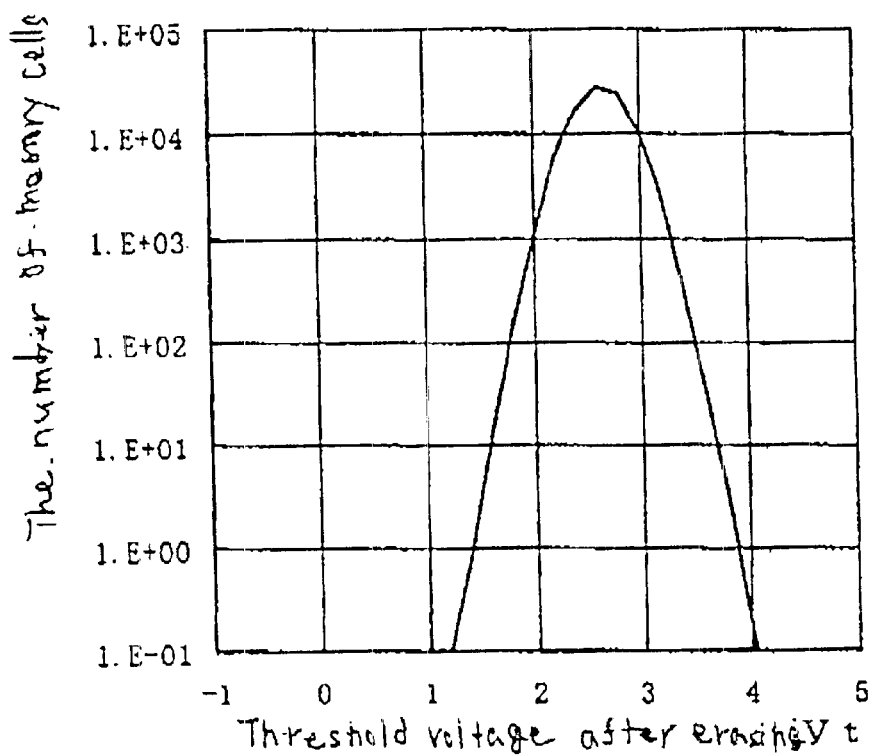
Fig. 3.(a) Threshold voltage. 4V
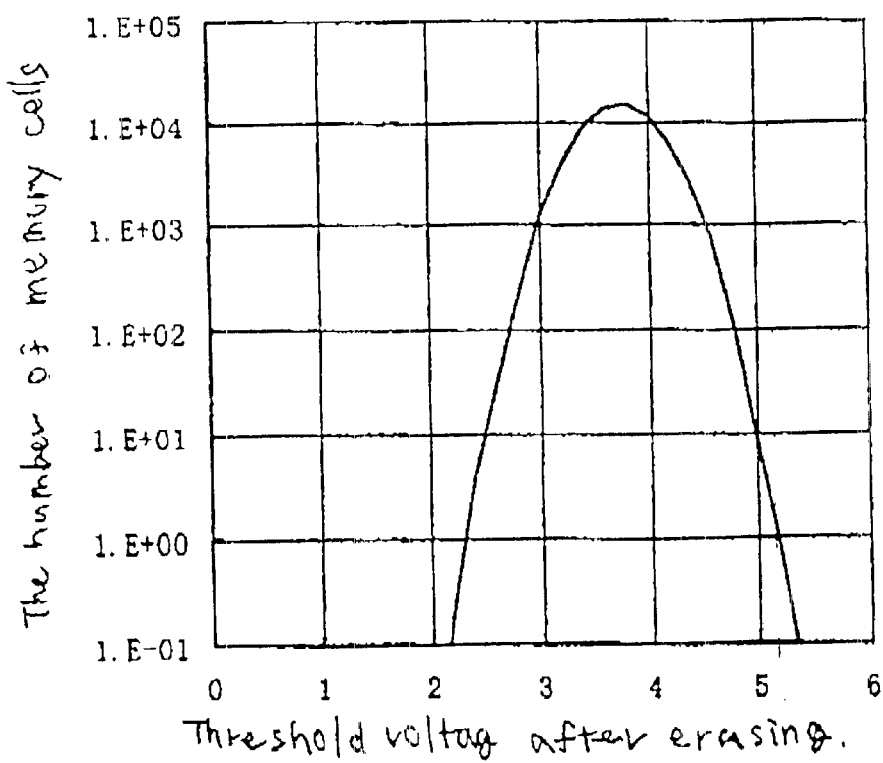
Fig. 3 (b) Threshold voltage. 6V

METHOD OF ERASING DATA STORED IN A NONVOLATILE MEMORY

BACKGROUND OF THE INVENTION

1. Field of the Invention

The present invention relates to a nonvolatile memory. In particular, the invention relates to a method of erasing data stored in a nonvolatile memory.

2. Description of the Related Art

A nonvolatile memory can be used as an analog memory, or a multi-value memory. A conventional memory cell of a nonvolatile memory comprises a transistor, which has a floating gate and control gate. The memory cell holds data as a threshold voltage Vt of the transistor. Each memory cell can have a plurality of threshold voltages Vt, and the threshold voltage Vt of each memory cell corresponds to data. If electrons are introduced into the floating gate, the threshold voltage becomes greater. On the other hand, if electrons are pulled out from the floating gate, the threshold voltage becomes smaller. The threshold voltage Vt depends on the amount of electrons present in the floating gate. In this specification, "erase" means pulling out electrons, and "write" means introducing electrons in order to simplify the description hereinafter.

When the data stored in a nonvolatile memory is erased, data is written into all of the memory cells before erasing. That is to say, the threshold voltages Vt of some of the memory cells are made greater. The reason is to avoid the threshold voltage Vt from becoming less than 0 v after erasing.

An analog memory or a multi value memory has a variety of threshold voltages. The variation of the threshold voltage is between V0L~V0H (V0L<V0H) or V1L~V1H (V1L<V1H). V0L~V0H corresponds to a state that the memory cell does not contain data, and V1L~V1H corresponds to a state that the memory cell contains data. All of the memory cells of these memories have data written thereinto before erasing, in order that the threshold voltages Vt of the memory cells stabilize after erasing. The highest threshold voltage (V1H) of the plurality of threshold voltages may be applied to write data into the memories before erasing. However, if the difference voltage ΔV of the highest threshold voltage (V1H) and the threshold voltage after erasing (for example 0 v) is too great, a high voltage ΔV has to be erased. This may result in unevenness of the threshold voltages Vt after erasing.

On the other hand, it is not preferable that a lower voltage Vt (for example lower than V1L) is applied to write data before erasing in order to decrease the difference voltage ΔV. This is because the memory cells, which may have higher threshold voltages Vt such as V1H, may remain as having higher threshold voltages V1H, because the lower voltage V1L results in a difference voltage ΔV, that is not enough to erase the higher threshold voltages in this case.

As described above, there are cases that the threshold voltages Vt after erasing are not in a range of a margin of error (V0L~V0H). This may result in a wrong data being stored in the nonvolatile memory.

SUMMARY OF THE INVENTION

The present invention is therefore directed to a method of erasing data stored in a nonvolatile memory which substantially overcomes one or more of the problems due to the limitations and the advantages of the related art.

To solve the above problems, a method for erasing data of nonvolatile memory includes adjusting a threshold voltage of a memory cell transistor to a first threshold voltage; adjusting the threshold voltage of the memory cell transistor to a second threshold voltage, the second threshold voltage being lower than the first threshold voltage; adjusting the threshold voltage of the memory cell transistor to a third threshold voltage, the third threshold voltage being higher than the second threshold voltage and being lower than the first threshold voltage and adjusting the threshold voltage of the memory cell transistor to a fourth threshold voltage, the fourth threshold voltage being lower than the second threshold voltage.

BRIEF DESCRIPTION OF THE DRAWINGS

FIG. 2 shows a distribution of threshold voltages Vt of a plurality of memory cells for each step of the first preferred embodiment of the present invention.

FIGS. 3(a) and (b) are diagrams of a probability distribution after erasing.

DETAILED DESCRIPTION OF THE PREFERRED EMBODIMENTS

The preferred embodiments are described below with reference to the drawings.

Figure 1:
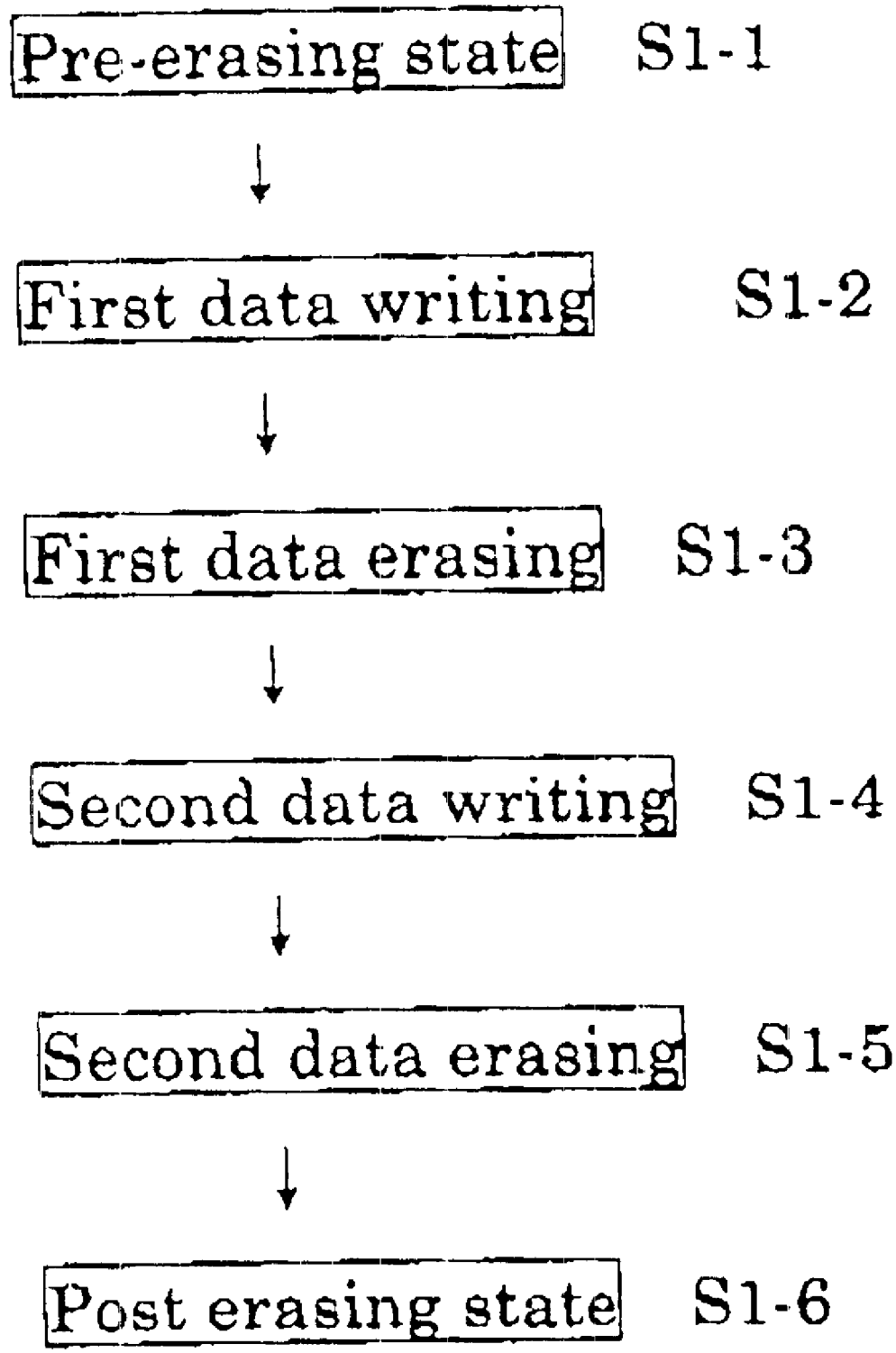
FIG. 1 is a flow chart descriptive of a method of erasing data of a first preferred embodiment of the present invention.

FIG. 1 is a flow chart showing the features of a method for erasing data of a first preferred embodiment. FIG. 2 shows a distribution of threshold voltages Vt of a plurality of memory cells for each step of the first preferred embodiment.

A memory cell of a nonvolatile memory for the first preferred embodiment is composed of a transistor (memory cell transistor), which has a control gate and a floating gate, and data stored in the memory cell depends on a threshold voltage of the transistor. The threshold voltage Vt is determined by an amount of electrons introduced into the floating gate, and the amount of the electrons is controlled by the voltage applied to the control gate during writing.

The nonvolatile memory has a plurality of memory cells, and each memory cell transistor of the first preferred embodiment has a threshold voltage Vt within V1L~V1H (higher range) when in a written into state, and has a threshold voltage Vt within V0L~V0H (lower range) when in an erased state. Each memory cell transistor has a certain threshold voltage corresponding to the data stored in each memory cell, before all of the memory cell transistors are erased. This pre-erasing state is represented in the flow chart of FIG. 1 as S1-1. For example, as shown in FIG. 2(a), memory cells MCa, MCb and MCc have threshold voltages of a written state, and memory cells MCd, MCe and MCf have threshold voltages of an erased state. The process for erasing all of the memory cells is described below.

The threshold voltages Vt of all of the memory cell transistors are raised to the highest threshold voltage V1H at first. All of the memory cells are therefore written into (a first writing). This process is performed by applying a certain voltage to the control gates. This is step S1-2 as shown in FIG. 1 and FIG. 2(b)

Then, the threshold voltages of all of the memory cell transistors are reduced to the highest level V0H of the lower range. This, all of the memory cells are erased (a first erasing). That is to say, the differences of the threshold voltages, which are reduced in this process, do not correspond to the difference potential ΔV between the highest potential V1H and the lowest potential V0L. This is step S1-3 as shown in FIG. 1 and FIG. 2(c)

Then, the threshold voltages of all the memory cell transistors are raised again. All of the memory cells are written into (a second writing). The threshold voltages Vt are raised to the lowest threshold voltage V1L of the higher. An unevenness of the threshold voltages after the first erasing is improved by performing the second writing, and the threshold voltages of the memory cells are almost even with respect to each other, after this step. This is step S1-4 as shown in FIG. 1 and FIG. 2(d).

Then, the threshold voltages of all of the memory cell transistors are reduced to the lowest level V0L of the lower. All of the memory cells are thus erased (a second erasing). This is step S1-5 as shown in FIG. 1 and FIG. 2(e). A most erasing state is subsequently featured in the flow chart of FIG. 1 as S1-6.

As described above, the threshold voltage of each memory cel reduced directly from the highest voltage V1H to the lowest voltage V0L in the first preferred embodiment. Writing and erasing are each performed two times respectively. The first writing raises the threshold voltage to the highest voltage V1H. However; the first erasing reduces the threshold voltage to the highest voltage V0H of the lower range, which is not the lowest threshold voltage V0L. The second writing raises the threshold voltage to the lowest voltage V1L of thehigher range. The second erasing reduces the threshold voltage from the lowest voltage V1L of the higher range, which is not the highest threshold voltage V1H, to the lowest voltage V0L of the lower range. Therefore, differences of the threshold voltage, which are reduced in each erasing, are decreased. In addition, the second writing of the first preferred embodiment makes the threshold voltages approximately even, therefore the threshold voltages of the memory cells are approximately even after the second erasing.

Although writing and erasing are each described as respectively performed twice in the first preferred embodiment. The threshold voltage may be make more even by performing each of the writing and erasing three times.

Pulses can be used to write data in the first writing and the second writing, instead of applying a fixed voltage to the control gate, in the first preferred embodiment. If pulses are applied to the control gate, the threshold voltage rises gradually. Therefore, verification can be performed during application of the pulses. The threshold voltages of the memory cells become more even in this case than the threshold voltages of memory cells which are written by fixed voltages, because of verification after writing. Therefore, the threshold voltages after the first and second writings become more even, and consequently the threshold voltages after the second erasing become more even if pulses are used during writing.

The second writing is performed in order to make the threshold voltages even in the first preferred embodiment. Therefore, a memory cell which has the highest threshold voltage before the first writing, does not have a higher threshold voltage after the second writing than before the first writing. In an exemplary embodiment, the threshold voltages after the first writing may be controlled for all of the memory cells, to correspond to a threshold voltage of the memory cell having the highest threshold voltage before the first writing.

Also, in order to reduce unevenness, the raised voltage of the second writing may be minimized. Therefore, in this case, the reduced voltage of the first erasing is greater than that of the second erasing. In the first preferred embodiment, the first erasing reduces the threshold voltages to V0H, however other voltages are available except for the lowest voltage V0L.

FIGS. 3(a) and (b) are diagrams of a probability distribution after erasing. FIGS. 3(a) and (b) are provided merely to exemplify an effect of the first preferred embodiment, however the voltage values shown in FIGS. 3(a) and (b) are not directly related to the first preferred embodiment, and thus should not be considered as limiting. All of the memory cells are erased under the same conditions in FIGS. 3(a) and (b) (applied voltage and time). FIG. 3(a) shows a probability distribution after erasing of memory cells which have an initial threshold voltage of 4V, and FIG. 3(b) shows a probability distribution after erasing of memory cells which have an initial threshold voltage of 6V.

If erasing is performed on memory cells which have a threshold voltage of 4V prior to erasing, a memory cell stochastically has a threshold voltage between about 1.4V and about 3.9V after erasing. There is thus an error of about 2.5V. On the other hand, if erasing is performed on memory cells which have a threshold voltage of 6V prior to erasing, a memory cell stochastically has a threshold voltage between about 2.3V and about 5.2V after erasing. There is thus an error of about 2.9V. As shown in FIGS. 3(a) and 3(b), a smaller reduced voltage makes the error of the threshold voltage after erasing smaller. Therefore, the reduced voltage may be smaller in a further embodiment. In according with this point, in the first preferred embodiment, the reduced voltage is made smaller than in a conventional erasing method, because it includes writing and erasing twice respectively.

As described above, the method for erasing data of the nonvolatile memory of the first preferred embodiment includes writing and erasing twice each. Therefore, the reduced voltage can be decreased during each erasing, and the unevenness of threshold voltages after erasing is improved.

Figure 4:
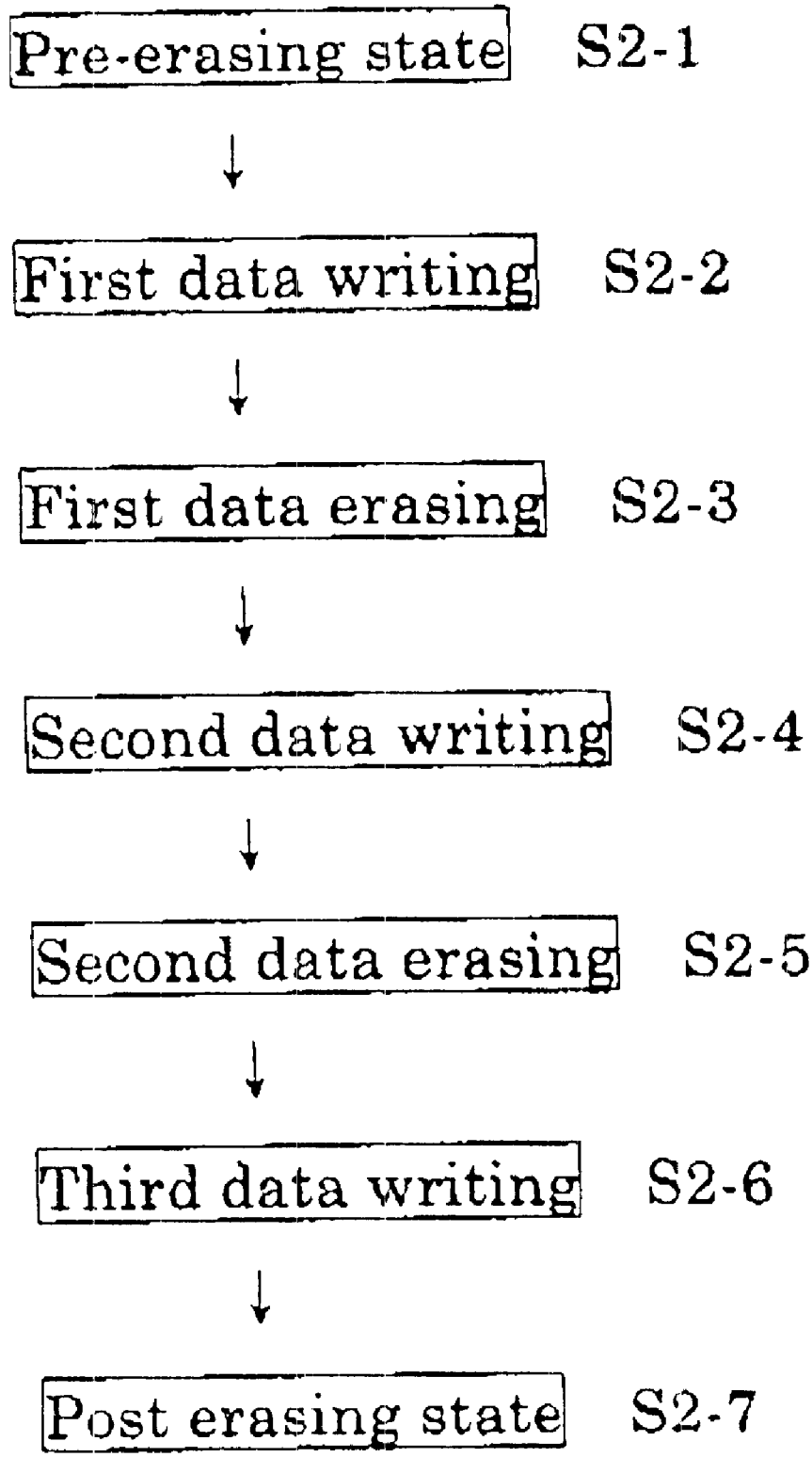
FIG. 4 is a flow chart descriptive of a method of erasing data of a second preferred embodiment of the present invention.
Figure 5:
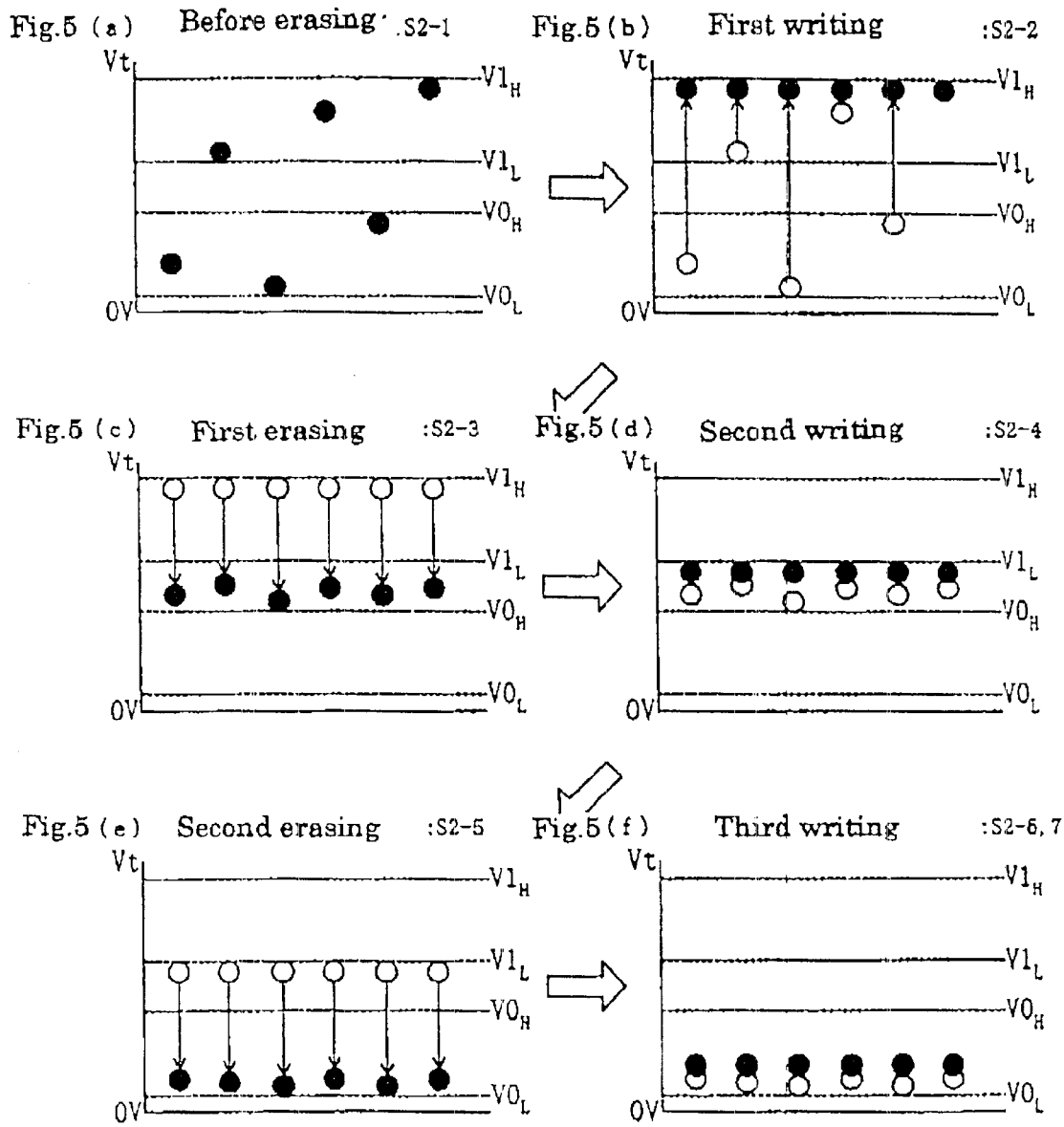
FIG. 5 shows a distribution of threshold voltages Vt of a plurality of memory cells for each step of the second preferred embodiment of the present invention.

FIG. 4 is a flow chart showing the features of a method for erasing data of a second preferred embodiment. FIG. 5 shows a distribution of threshold voltages Vt of a plurality of memory cells for each step of the second preferred embodiment.

The method for erasing data of the second preferred embodiment has the steps corresponding to first and second data writings (FIGS. 5(b), (d)), and first and second erasings (FIGS. 5(c), (e)) described in the first preferred embodiment. FIGS. 5(a)~(e) correspond to FIGS. 2(a)~(e) respectively. The second preferred embodiment further includes a third writing as shown in FIG. 5(f) (S2-6 as shown in FIG. 5), in addition to above-noted steps. In order to stabilize the threshold voltages, the differences of voltages of the last writing (or erasing) are minimized, in the second preferred embodiment, by the third writing. Therefore, it is possible to obtain more even threshold voltages of each memory cell than in the first preferred embodiment. As described in the first embodiment, it is also preferable that the reduced voltage in the first erasing is greater than that of the second erasing.

Figure 6:
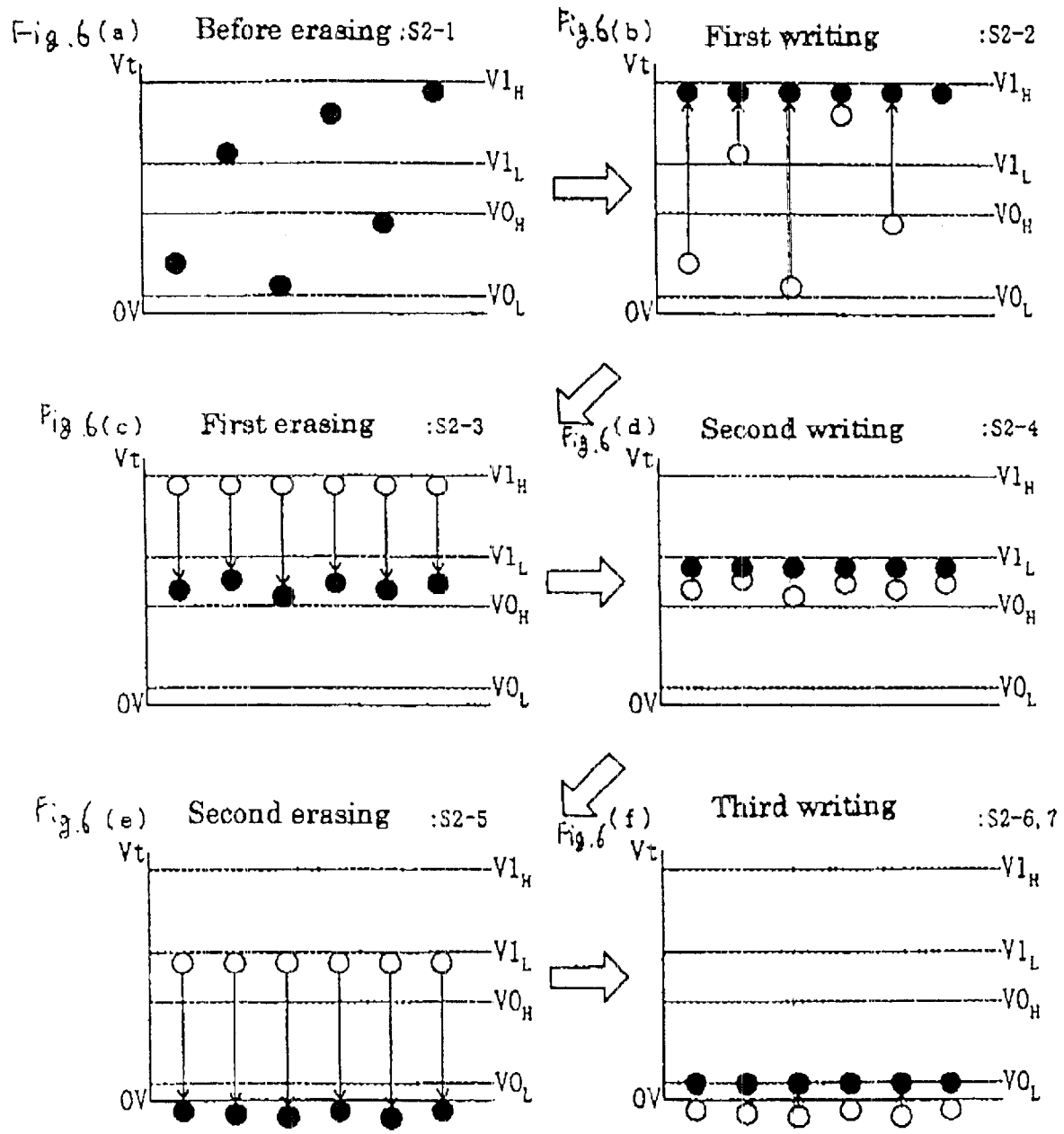
FIG. 6 shows a distribution of threshold voltages Vt of a plurality of memory cells for each step of a third preferred embodiment of the present invention.

FIG. 6 shows a distribution of threshold voltages Vt of a plurality of memory cells in each step of a third preferred embodiment.

The method for erasing data of the third preferred embodiment has the steps corresponding to the first and second writings (FIGS. 6(b), (d)) and the first and second erasing (FIGS. 6(c), (e)) described in the first preferred embodiment. FIGS. 6(a)~(e) correspond to FIGS. 2(a)~(e) respectively. The third preferred embodiment further has a third writing in addition to these steps as shown in FIG. 6(f).

It is preferable that the threshold voltages after erasing are close to 0V as possible. Therefore, in the third embodiment, the threshold voltages are reduced under 0V after the second erasing as shown in FIG. 6(e), and a third writing in addition to these steps is subsequently performed as shown in FIG. 6(f). Therefore, the threshold voltages after the third writing become lower than the other embodiments. As described in the first embodiment, it is also preferable that the reduced voltage responsive to the first erasing is bigger than that responsive to the second erasing.

Figure 7:
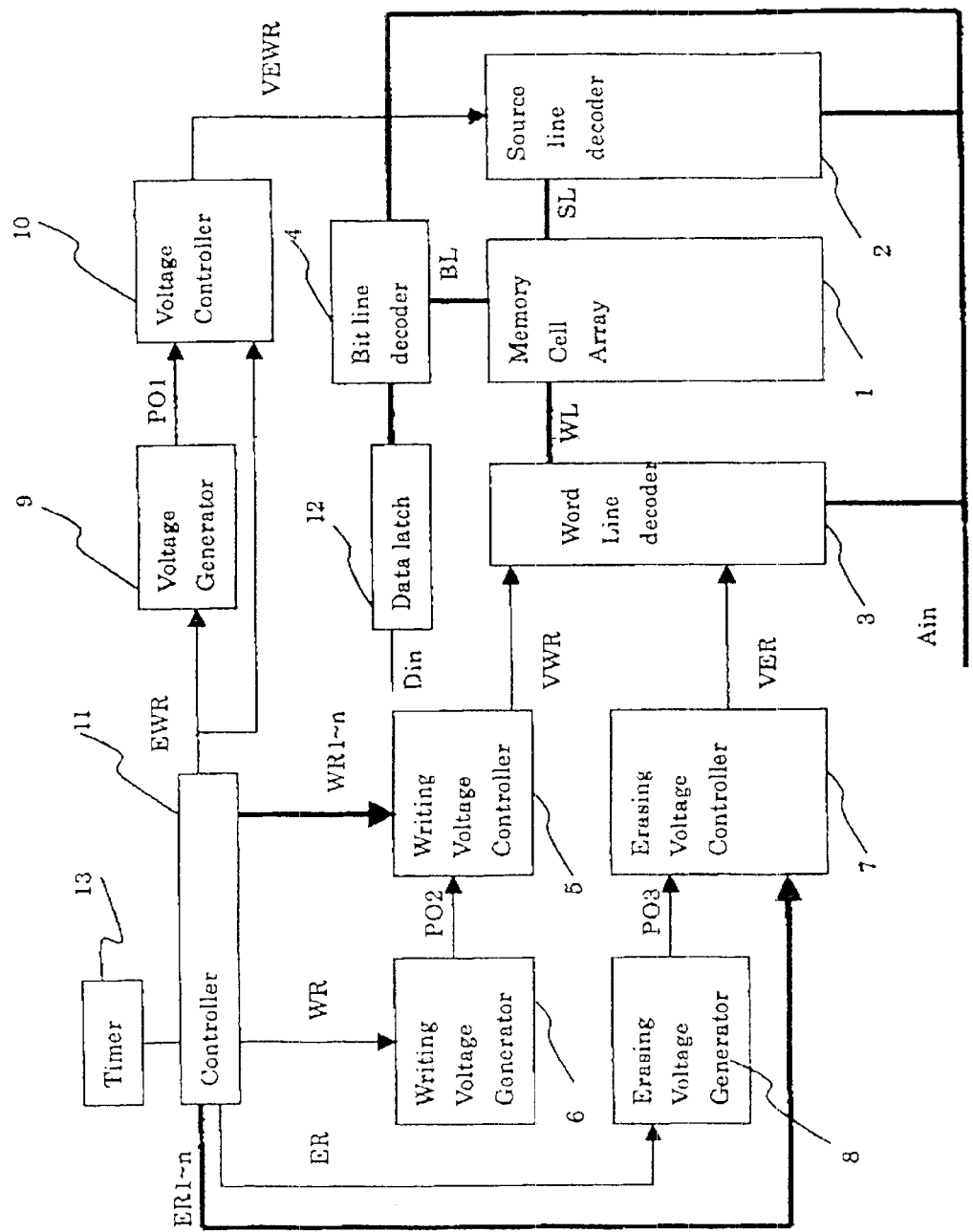
FIG. 7 shows a nonvolatile semiconductor device that performs the method of the embodiments of the present invention.

A nonvolatile semiconductor device to perform the method of the above embodiments is described with respect to FIG. 7. The nonvolatile semiconductor device has a memory cell array 1, a source line decoder 2, a word line decoder 3, a bit line decoder 4, a writing voltage controller 5, a writing voltage generator 6, an erasing voltage controller 7, an erasing voltage generator 8, a voltage generator 9, a voltage controller 10, a control circuit 11, a data latch circuit 12 and a timer circuit 13.

The word line decoder 3, the bit line decoder 4 and the source line decoder 5 are connected to the memory cell array through the word line WL, bit line BL and the source lines SL, respectively. The bit line decoder 4 is connected to the data latch circuit 12, which holds a writing data.

The word line decoder 3 decodes an address and selects a word line according to the address. The bit line decoder 4 decodes an address and selects a bit line according to the address. The source line decoder 2 decodes an address and selects a source line according to the address. According to the selected lines, a memory cell is selected from the memory cell array 1, and writing, reading or erasing is performed.

A writing voltage VWR is supplied to the word line decoder 3 from the writing voltage controller 5. The writing voltage controller 5 adjusts an output voltage PO2 of the writing voltage generator 6 to the voltages corresponding to data writing signals WR1~n, and outputs the writing voltage VWR. For writing before erasing, each of data writing signals WR1~n corresponds to each writing (for example the first writing, the second writing and the third writing). However, for normal operation (without writing before erasing), each of data writing signals WR1~n corresponds to data stored in each memory cell.

An erasing voltage VER is supplied to the word line decoder 3 from the erasing voltage controller 7. The erasing voltage controller 7 adjusts an output voltage PO3 of the erasing voltage generator 7 to the voltages corresponding to a data erasing signal ER1~n, and outputs the erasing voltage VER. Each of data erasing signals ER1~n corresponds to each erasing (for example the first erasing and the second erasing).

A first data writing enable operation signal WR is output from the control circuit 11, and the writing voltage generator 6 outputs the output voltage PO2 for the first writing responsive thereto. A second data writing enable operation signal WR is also output from the control circuit 11, and the writing voltage generator 6 outputs the output voltage PO2 for the second writing responsive thereto. In order to perform the third writing, a third data writing enable operation signal WR is also output from the control circuit 11.

A first data erasing enable operation signal ER is output from the control circuit 11, and the erasing voltage generator 8 outputs the output voltage PO3 for the first erasing responsive thereto. A second data erasing enable operation signal ER is also output from the control circuit 11, and the erasing voltage generator 8 outputs the output voltage PO2 for the second erasing responsive thereto.

The control circuit 11 is connected to the timer circuit 13. A period for outputting data writing signals ER1~n, the data writing operation enable signals ER, data writing signals WR1~n and the data writing enable operation signals is controlled by the timer circuit 13.

For a writing operation; the control circuit 11 outputs the data writing operation enable signal ER and the data writing signals ER1~n. The voltage writing generator 6 outputs the output voltage PO2, and the writing voltage controller 5 adjusts the voltage PO2 according to data writing signals WR1~n. The memory cells are thus written into according to the data writing signals WR1~n.

For an erasing operation, the control circuit outputs the data erasing operation enable signal ER and the data erasing signals ER1~n. The voltage erasing generator 8 outputs the output voltage PO3, and the erasing voltage controller 7 adjusts the voltage PO3 according to data erasing signals ER1~n. The memory cells are thus erasecd according to the data erasing signals ER1~n.

What is claimed is:

1. A method for erasing data of a nonvolatile memory comprising:
   adjusting a threshold voltage of a memory cell transistor of the nonvolatile memory to a first threshold voltage;
   adjusting the threshold-voltage of the memory cell transistor to a second threshold voltage, the second, threshold voltage being lower than the first threshold voltage;
   adjusting the threshold, voltage of the memory cell transistor to a third threshold voltage, the third threshold voltage being higher than the second threshold voltage and being lower than the first threshold voltage; and
   adjusting the threshold voltage of the memory cell transistor to a fourth threshold voltage, the fourth threshold voltage being lower than the second threshold voltage.

2. The method for erasing data of a nonvolatile memory as claimed in claim 1, wherein the first threshold voltage is a highest voltage within a higher range, the higher range being a range corresponding to a written state of the memory cell transistor.

3. The method for erasing data of nonvolatile memory as claimed in claim 1, wherein the second threshold voltage is the highest voltage within a lower range, the lower range being a range corresponding to an erased state of the memory cell transistor.

4. The method for erasing data of a nonvolatile memory as claimed in claim 1, wherein the third threshold voltage is a lowest voltage within a higher range, the higher range being a range corresponding to a written state of the memory cell transistor.

5. The method for erasing data of nonvolatile memory as claimed in claim 1, wherein the fourth threshold voltage is the lowest voltage within a lower range, the lower range being a range corresponding to an erased state of the memory cell transistor.

6. The method for erasing data of a nonvolatile memory as claimed in claim 2, wherein the second threshold voltage is the highest voltage within a lower range, the lower range being a range corresponding to an erased state of the memory cell transistor.

7. The method for erasing data of a nonvolatile memory as claimed in claim 2, wherein the third threshold voltage is the lowest voltage within the higher range.

8. The method for erasing data of a nonvolatile memory as claimed in claim 2, wherein the fourth threshold voltage is the lowest voltage within a lower range, the lower range being a range corresponding to an erased state of the memory cell transistor.

9. The method for erasing data of a nonvolatile memory as claimed in claim 6, wherein the third threshold voltage is a lowest voltage within the higher range.

10. The method for erasing data of a nonvolatile memory as claimed in claim 6, wherein the fourth threshold voltage is a lowest voltage within the lower range.

11. The method for erasing data of a nonvolatile memory as claimed in claim 9, wherein the fourth threshold voltage is a lowest voltage within the lower range.

12. The method for erasing data of a nonvolatile memory as claimed in claim 1, wherein a difference between the first threshold voltage and the second threshold voltage is greater than a difference between the third threshold voltage and the fourth threshold voltage.

13. The method for erasing data of a nonvolatile memory as claimed in claim 6, wherein a difference between the first threshold voltage and the second threshold voltage is greater than a difference between the third threshold voltage and the fourth threshold voltage.

14. The method for erasing data of a nonvolatile memory as claimed in claim 10, wherein a difference between the first threshold voltage and the second threshold voltage is greater than a difference between the third threshold voltage and the fourth threshold voltage.

15. The method for erasing data of a nonvolatile memory as claimed in claim 9, wherein a difference between the first threshold voltage and the second threshold voltage is greater than a difference between the third threshold voltage and the fourth threshold voltage.

16. The method for erasing data of a nonvolatile memory as claimed in claim 11, wherein a difference between the first threshold voltage and the second threshold voltage is greater than a difference between the third threshold voltage and the fourth threshold voltage.

17. The method for erasing data of a nonvolatile memory as claimed in claim 1, further comprising:
  adjusting the threshold voltage of the memory cell transistor to a fifth threshold voltage, the fifth threshold voltage being lower than the second threshold voltage and higher than the fourth threshold voltage.

18. The method for erasing data of a nonvolatile memory as claimed in claim 12, wherein the first threshold voltage is the highest voltage within a higher range, the higher range being a range corresponding to a written state of the memory cell transistor.

19. The method for erasing data of a nonvolatile memory as claimed in claim 18, wherein the third threshold voltage is a lowest voltage within the higher range, which is the range of a written state.

20. The method for erasing data of a nonvolatile memory as claimed in claim 19, wherein the fourth threshold voltage is the lowest voltage within a lower range, the lower range being a range corresponding to an erased state of the memory cell transistor.

21. The method for erasing data of a nonvolatile memory as claimed in claim 19, wherein the fourth threshold voltage is the lower than 0V.

* * * * *